(12) United States Patent
Kim et al.

(10) Patent No.: US 10,804,132 B2
(45) Date of Patent: Oct. 13, 2020

(54) APPARATUS FOR MANUFACTURING SEMICONDUCTOR

(71) Applicant: SAMSUNG ELECTRONICS CO., LTD., Suwon-si, Gyeonggi-do (KR)

(72) Inventors: Kyoung-jun Kim, Yongin-si (KR); Si-han Kim, Seoul (KR); Tae-hyun Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 233 days.

(21) Appl. No.: 15/903,144

(22) Filed: Feb. 23, 2018

(65) Prior Publication Data

US 2019/0080954 A1    Mar. 14, 2019

(30) Foreign Application Priority Data

Sep. 8, 2017   (KR) .......................... 10-2017-0115133

(51) Int. Cl.

| | |
|---|---|
| *H01L 21/683* | (2006.01) |
| *H01L 21/677* | (2006.01) |
| *H01L 21/67* | (2006.01) |
| *G06T 7/73* | (2017.01) |
| *H01L 21/68* | (2006.01) |

(52) U.S. Cl.
CPC .......... *H01L 21/6838* (2013.01); *G06T 7/73* (2017.01); *H01L 21/677* (2013.01); *H01L 21/67011* (2013.01); *H01L 21/67144* (2013.01); *H01L 21/682* (2013.01); *G05B 2219/45031* (2013.01)

(58) Field of Classification Search
USPC .................... 118/500, 728; 269/21; 414/941; 156/937; 219/121.7
See application file for complete search history.

(56) References Cited

U.S. PATENT DOCUMENTS

| | | | |
|---|---|---|---|
| 6,372,608 B1 | 4/2002 | Shimoda et al. | |
| 6,592,671 B2* | 7/2003 | Sun ...................... | A61K 9/2072 118/500 |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |

(Continued)

FOREIGN PATENT DOCUMENTS

| | | |
|---|---|---|
| JP | 06-077317 A | 3/1994 |
| JP | 4758780 B2 | 8/2011 |

(Continued)

OTHER PUBLICATIONS

English Translations of JP 4758785-JP2007201259 (Year: 2007).*

*Primary Examiner* — Yewebdar T Tadesse

(74) *Attorney, Agent, or Firm* — Lee IP Law, P.C.

(57) ABSTRACT

A semiconductor manufacturing apparatus including a transport head that includes a vacuum chuck, the vacuum chuck being configured to vacuum-hold light-emitting element chips; and a vacuum pump that is configured to provide a vacuum pressure to the transport head, wherein the vacuum chuck includes a porous material layer and a buffer layer on the porous material layer, and the buffer layer includes a plurality of protrusions and vacuum holes, the vacuum holes extending from a surface of the buffer layer that contacts the porous material layer to lower surfaces of the protrusions.

8 Claims, 21 Drawing Sheets

(56) References Cited

U.S. PATENT DOCUMENTS

| | | |
|---|---|---|
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,415,771 B1 | 4/2013 | Golda et al. |
| 8,426,227 B1 | 4/2013 | Bibl et al. |
| 8,432,511 B2 | 4/2013 | Eong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,912,045 B2 | 12/2014 | Dang et al. |
| 9,245,787 B2 * | 1/2016 | Jeon ................ H01L 24/97 |
| 9,698,134 B2 | 7/2017 | Li et al. |
| 2002/0096994 A1 | 7/2002 | Iwafuchi et al. |
| 2012/0313332 A1 | 12/2012 | Jeon et al. |
| 2013/0270756 A1* | 10/2013 | Wimplinger ........ H01L 21/6838 269/21 |
| 2017/0103964 A1 | 4/2017 | Bower et al. |
| 2017/0148650 A1 | 5/2017 | Wu et al. |

FOREIGN PATENT DOCUMENTS

| | | |
|---|---|---|
| JP | 2017-108043 A | 6/2017 |
| KR | 10-2011-0078583 A | 7/2011 |
| KR | 10-2012-0124700 A | 11/2012 |
| KR | 10-2012-0137859 A | 12/2012 |
| KR | 10-1619876 B1 | 5/2016 |

* cited by examiner

APPARATUS FOR MANUFACTURING SEMICONDUCTOR

CROSS-REFERENCE TO RELATED APPLICATION

Korean Patent Application No. 10-2017-0115133, filed on Sep. 8, 2017, in the Korean Intellectual Property Office, and entitled: "Apparatus for Manufacturing Semiconductor," is incorporated by reference herein in its entirety.

BACKGROUND

1. Field

Embodiments relate to an apparatus for manufacturing a semiconductor.

2. Description of the Related Art

A light-emitting element chip may be used for various light sources, illuminations, signal flags, and large displays due its low power consumption and high brightness, etc. As an image display device, a display device that uses a light-emitting element chip array in which the light-emitting element chips are arranged in a two dimensional (2D) array has been used. The display device may be manufactured through a process that, after packaging individual light-emitting element chips into a light-emitting package, the individual light-emitting packages are arranged on a module substrate through a pick and place method. Recently, in order to realize a large size and high resolution display device, the number of light-emitting element chips included in the display device is increased.

SUMMARY

The embodiments may be realized by providing a semiconductor manufacturing apparatus including a transport head that includes a vacuum chuck, the vacuum chuck being configured to vacuum-hold light-emitting element chips; and a vacuum pump that is configured to provide a vacuum pressure to the transport head, wherein the vacuum chuck includes a porous material layer and a buffer layer on the porous material layer, and the buffer layer includes a plurality of protrusions and vacuum holes, the vacuum holes extending from a surface of the buffer layer that contacts the porous material layer to lower surfaces of the protrusions.

The embodiments may be realized by providing a semiconductor manufacturing apparatus including a transport head configured to transport selected first light-emitting element chips of a plurality of first light-emitting element chips arranged with a first pitch on a first substrate to a second substrate by holding the selected first light-emitting element chips; and an adhesion force controller that reduces an adhesion force of the first substrate, wherein the adhesion force controller is configured to reduce an adhesion force of a region of the first substrate that vertically overlaps the selected first light-emitting element chips, the transport head is configured to transport the selected first light-emitting element chips to the second substrate by holding the selected first light-emitting element chips, and the transport head is configured to arrange the selected first light-emitting element chips on the second substrate with a second pitch that is greater than the first pitch.

The embodiments may be realized by providing a semiconductor manufacturing apparatus including a first supporting chuck configured to support a first substrate having a first film to which a chip array is attached, the chip array including a plurality of light-emitting element chips; a second supporting chuck configured to support a second substrate having a second film having an adhesion force that is greater than that of the first film and arranged above the first supporting chuck so that the second film faces the first film; and a chuck driver configured to move at least one of the first supporting chuck and the second supporting chuck so that the chip array on the first film is attached to the second film.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, embodiments are described in detail with reference to the accompanying drawings.

Figure 1:
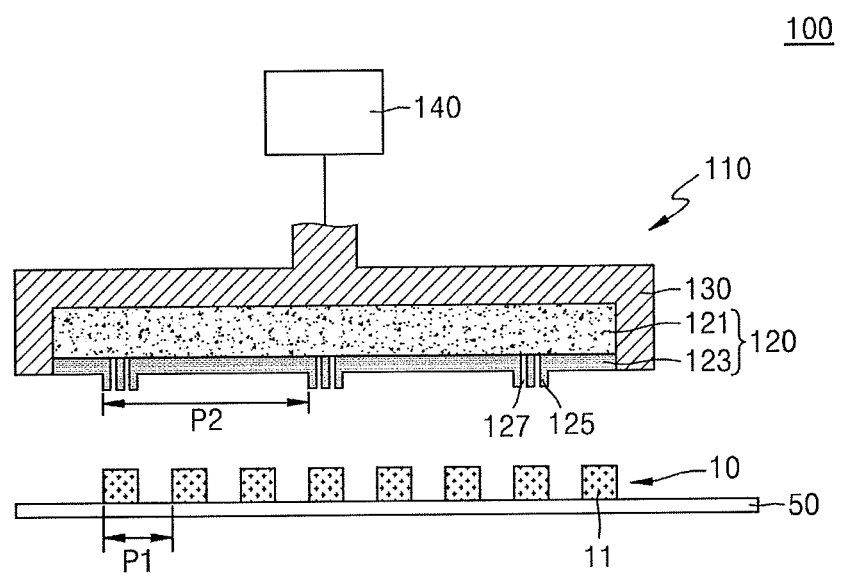
FIG. 1 illustrates a cross-sectional view of a semiconductor manufacturing apparatus according to some embodiments.

FIG. 1 illustrates a cross-sectional view of a semiconductor manufacturing apparatus 100 according to some embodiments.

Referring to FIG. 1, the semiconductor manufacturing apparatus 100 may include a transport head 110 (for holding a light-emitting element chip 11) and a vacuum pump 140 (for providing a vacuum pressure to the transport head 110). The semiconductor manufacturing apparatus 100 may be a transport apparatus for transporting a plurality of light-emitting element chips 11 on or from a first substrate 50 to a second substrate different from the first substrate 50.

The transport head 110 may simultaneously vacuum-hold (e.g., vacuum-adsorb or vacuum-grip) a plurality of the light-emitting element chips 11, and may simultaneously transport the light-emitting element chips 11 that have been vacuum-held. In an implementation, a chip array 10 (including the light-emitting element chips 11 arranged in a first pitch P1) may be attached to the first substrate 50. The transport head 110 may selectively vacuum-adsorb some of (e.g., selected light-emitting element chips of) the light-emitting element chips 11 of the chip array 10 on the first substrate 50, and may transport the light-emitting element chips 11 (that have been vacuum-held) to a second substrate different from the first substrate 50. The transport head 110 may arrange the light-emitting element chips 11 (that have been vacuum-held) on the second substrate with a second pitch that is greater than the first pitch P1.

In an implementation, the first substrate 50 may be a supporting film having a predetermined adhesiveness for fixing the light-emitting element chips 11. In an implementation, the first substrate 50 may be a substrate, such as a semiconductor wafer, a glass substrate, a sapphire substrate, or a plastic substrate on which the light-emitting element chips 11 are formed.

The transport head 110 may include a chuck frame 130 and a vacuum chuck 120 (that is accommodated in a cavity of the chuck frame 130).

A pressure of an inner side of the vacuum chuck 120 may be controlled by the vacuum pump 140, and thus, the vacuum chuck 120 may vacuum-hold the light-emitting element chips 11 by applying a vacuum pressure formed inside the vacuum chuck 120 to a lower surface thereof. The vacuum chuck 120 may include a porous material layer 121 and a buffer layer 123 (disposed on a surface of the porous material layer 121).

The porous material layer 121 may be a part where a vacuum pressure is formed or the vacuum pressure is released by the vacuum pump 140. The porous material layer 121 may be arranged inside the cavity of the chuck frame 130, an upper surface and a side surface of the porous material layer 121 may be covered by the chuck frame 130. In an implementation, the porous material layer 121 may include ceramic, alumina, mulite, or silicon carbide or a combination of these materials.

In an implementation, the pore size and pore density of the porous material layer 121 may be determined or selected so that an appropriate vacuum pressure may be applied to the light-emitting element chips 11. The pore size and pore density of the porous material layer 121 may be controlled or selected according to the size of the light-emitting element chips 11. Here, the pore size may denote a mean diameter of pores.

In an implementation, when the size of the light-emitting element chips 11, e.g., a length of a long side of the light-emitting element chips 11, is in a range of 1 μm to 300 μm, the pore size may be in a range of about 0.1 μm to about 30 μm. In an implementation, the pore size may be in a range of about 0.1 μm to about 20 μm.

In an implementation, when the size of the light-emitting element chips 11, e.g., a length of a long side of the light-emitting element chips 11, is in a range of 1 μm to 300 μm, the porous material layer 121 may be formed such that at least one pore is located within a range of about 1 μm to about 300 μm. In an implementation, the porous material layer 121 may be formed such that at least one pore is located within a range of about 50 μm to about 200 μm.

The buffer layer 123 may be arranged on a lower surface of the porous material layer 121, and may be a part of the transport head 110 that directly contacts the light-emitting element chips 11. The buffer layer 123 may include a material having a predetermined elasticity to help prevent damage to the light-emitting element chips 11 when the buffer layer 123 contacts the light-emitting element chips 11. In an implementation, the buffer layer 123 may include, e.g., silicone, an epoxy group resin, a polyimide group resin, a polyester group resin, Teflon, polydimethylsiloxan (PDMS), or a combination of these materials.

The buffer layer 123 may be detachably attached to the porous material layer 121. In an implementation, the buffer layer 123 may be replaceable, e.g., may be replaced with a new buffer layer after being used for a plurality of transport processes with respect to the light-emitting element chips 11.

The buffer layer 123 may include vacuum holes 127 to apply a vacuum pressure (formed in the porous material layer 121) to a lower side. The vacuum holes 127 may extend from an upper surface of the buffer layer 123 (that contacts the porous material layer 121) to a lower surface of the buffer layer 123 (opposite to the upper surface of the buffer layer 123).

In an implementation, the buffer layer 123 may include a plurality of protrusions 125 arranged on the lower surface of the buffer layer 123. The protrusions 125 may protrude by a predetermined height or distance, e.g., in a range of about 10 μm to about 100 μm, from the lower, e.g., planar, surface of the buffer layer 123. The vacuum holes 127 may be formed in only portions corresponding to the protrusions 125, and may vertically pass through the protrusions 125. The vacuum holes 127 may extend from the upper surface of the buffer layer 123 to lower surfaces of the protrusions 125. A vacuum pressure may be applied to the lower surfaces of the protrusions 125 through the vacuum holes 127, and the light-emitting element chips 11 transported by the transport head 110 may be fixed on the lower surfaces of the protrusions 125.

Gaps or distances between the protrusions 125 may be greater than gaps or distances between the light-emitting element chips 11 on the first substrate 50. For example, the protrusions 125 may be arranged to correspond to the light-emitting element chips 11 of the chip array 10 to be transported on the first substrate 50. In an implementation, the protrusions 125 may be arranged with a second pitch P2, and, of the chip array 10 on the first substrate 50, the transport head 110 may hold some or selected ones of the light-emitting element chips 11 arranged with the second pitch P2. Here, the second pitch P2 may be an integer multiple of the first pitch P1, e.g., twice, . . . N times (N is a natural number).

FIGS. 2A through 2E illustrate cross-sectional views of stages in a process of transporting the light-emitting element chips 11 by using the semiconductor manufacturing apparatus 100 of FIG. 1.

Figure 2A:
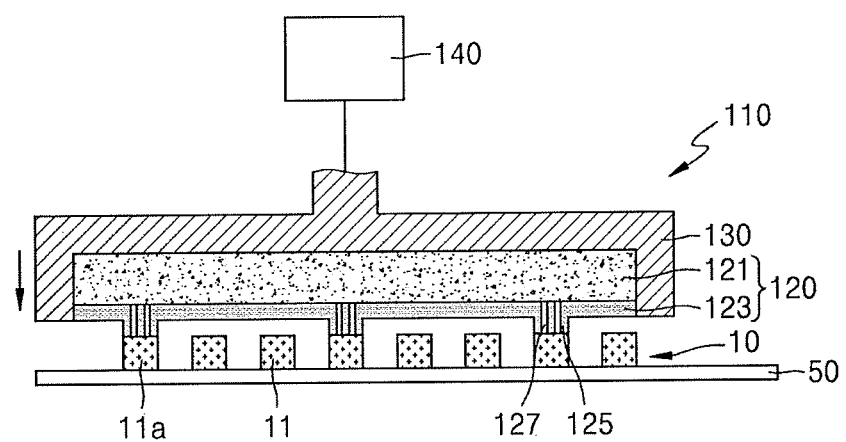
FIGS. 2A through 2E illustrate cross-sectional views of stages in a process of transporting light-emitting element chips by using the semiconductor manufacturing apparatus of FIG. 1.

Referring to FIG. 2A, the transport head 110 may be lowered so that the buffer layer 123 contacts the light-emitting element chips 11 on the first substrate 50. The protrusions 125 of the buffer layer 123 may contact some of the light-emitting element chips 11 on the first substrate 50 (e.g., selected light-emitting element chips 11). For example, the protrusions 125 of the buffer layer 123 may contact a first group of light-emitting element chips 11a arranged with the second pitch P2.

Figure 2B:
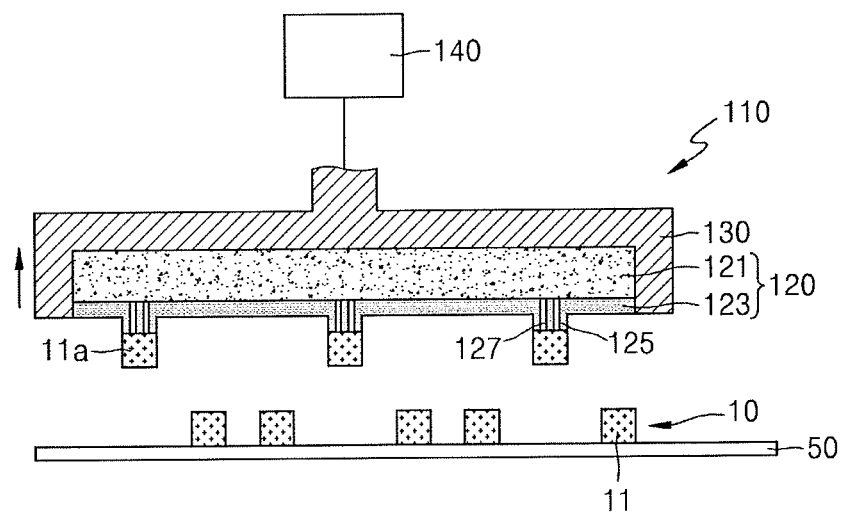

Referring to FIG. 2B, the transport head 110 may vacuum-hold the first group of the light-emitting element chips 11a by reducing a pressure inside the vacuum chuck 120 by using the vacuum pump 140. For example, a vacuum pressure may be formed in the porous material layer 121 by the vacuum pump 140, and the vacuum pressure may be applied towards the lower surfaces of the protrusions 125 through the vacuum holes 127 of the buffer layer 123. Thus, the first group of the light-emitting element chips 11a may be fixed on the lower surfaces of the protrusions 125 by the vacuum pressure applied to the lower surfaces of the protrusions 125.

Next, the transport head 110 may be lifted. As depicted in FIG. 2B, the transport head 110 may selectively pick up the first group of the light-emitting element chips 11a corresponding to the protrusions 125.

Figure 2C:
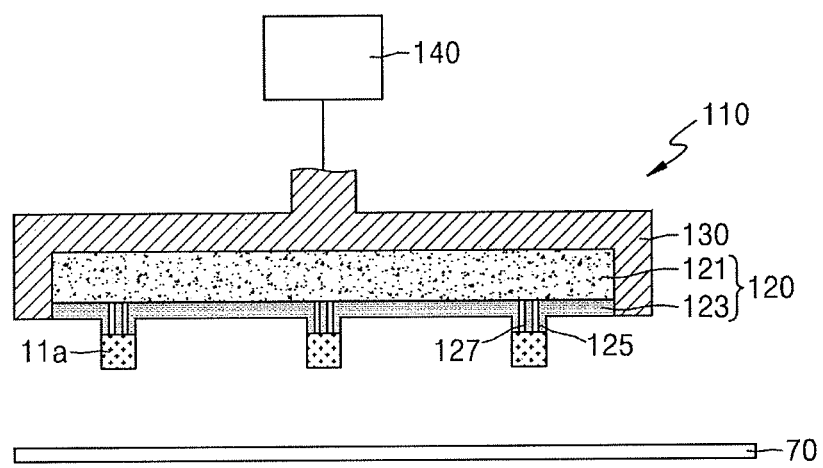

Referring to FIG. 2C, the transport head 110 may move to a second substrate 70 while holding the first group of the light-emitting element chips 11a. The transport head 110 may be located above the second substrate 70 to be aligned in a vertical direction with respect to the second substrate 70. In an implementation, in order to align the transport head 110 with the second substrate 70, an align mark provided on the second substrate 70 may be used.

Figure 2D:
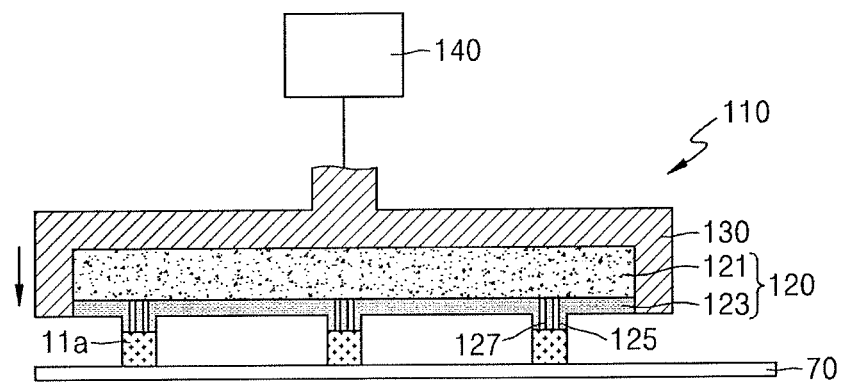

Referring to FIG. 2D, the first group of the light-emitting element chips 11a may contact the second substrate 70 by lowering the transport head 110.

Figure 2E:
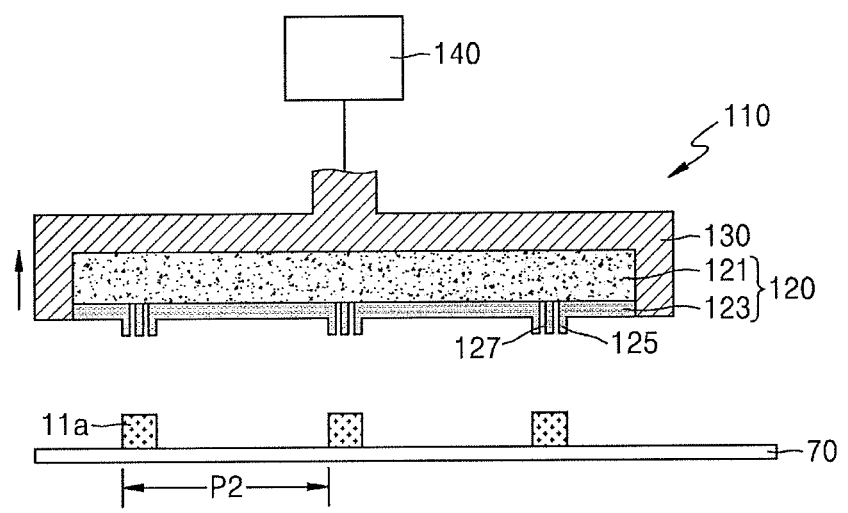

Referring to FIG. 2E, the vacuum pressure of the vacuum chuck 120 may be released so that the first group of the light-emitting element chips 11a may be seated on the second substrate 70. The second substrate 70 may support the first group of the light-emitting element chips 11a, e.g., may have an adhesive force for holding the first group of the light-emitting element chips 11a. By the transport head 110, the first group of the light-emitting element chips 11a may be arranged on the second substrate 70 to correspond to the protrusions 125. For example, the first group of the light-emitting element chips 11a may be arranged on the second substrate 70 with the second pitch P2.

After the vacuum pressure of the transport head 110 is released, the transport head 110 may be lifted and separated from the first group of the light-emitting element chips 11a.

The semiconductor manufacturing apparatus 100 according to the embodiments may simultaneously transport a plurality of the light-emitting element chips 11, and thus, the light-emitting element chips 11 may be rapidly transported to a target substrate. Also, through selective transport of the light-emitting element chips 11, the light-emitting element chips 11 may be arranged on the target substrate with increased gaps between chips.

Figure 3A:
FIGS. 3A through 3C illustrate cross-sectional views of stages in a method of manufacturing a vacuum chuck of FIG. 1.
Figure 3B:
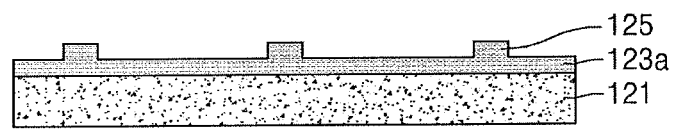
Figure 3C:
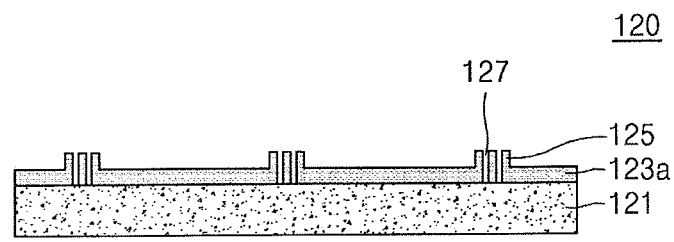

FIGS. 3A through 3C illustrate cross-sectional views of stages in a method of manufacturing the vacuum chuck 120 of FIG. 1.

Referring to FIG. 3A, after preparing the porous material layer 121, a buffer layer 123a may be formed on the porous material layer 121. In an implementation, the buffer layer 123a may be formed by coating a polymer material on the porous material layer 121. The buffer layer 123a may be formed to cover a surface of the porous material layer 121.

Referring to FIG. 3B, the protrusions 125 may be formed on the buffer layer 123a. The protrusions 125 may be arranged in a two dimensional array. In an implementation, the protrusions 125 may be formed by an imprint process with respect to the buffer layer 123a. In an implementation, the protrusions 125 may be formed by using an etching process by which a portion of an upper portion of the buffer layer 123a is removed.

Referring to FIG. 3C, the vacuum holes 127 that vertically penetrate through the buffer layer 123a may be formed. The vacuum holes 127 may extend from a surface of the protrusions 125 to a surface of the buffer layer 123a that contacts the porous material layer 121. In an implementation, the vacuum holes 127 may be formed by using a laser drilling process or an etch process.

In an implementation, the protrusions 125 and the vacuum holes 127 may be simultaneously formed by using an imprint process. In this case, a laser drilling process may further be performed so that the porous material layer 121 is completely exposed through the vacuum holes 127.

In an implementation, in order to form the buffer layer 123a including the protrusions 125 and the vacuum holes 127 on the porous material layer 121, a printing process may be performed by using a printer, such as a 3D printer, an inkjet printer, or a screen printer.

Figure 4A:
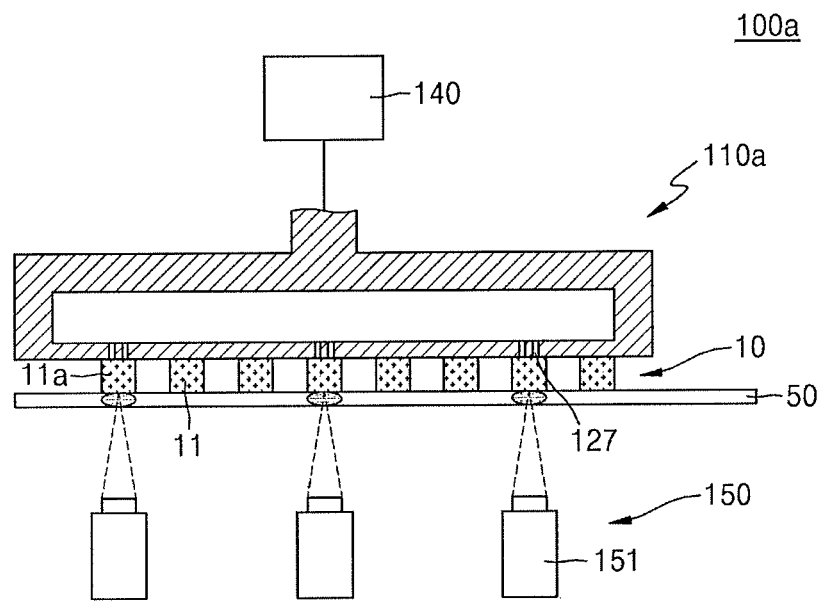
FIGS. 4A and 4B illustrate cross-sectional views of a semiconductor manufacturing apparatus according to some embodiments.
Figure 4B:
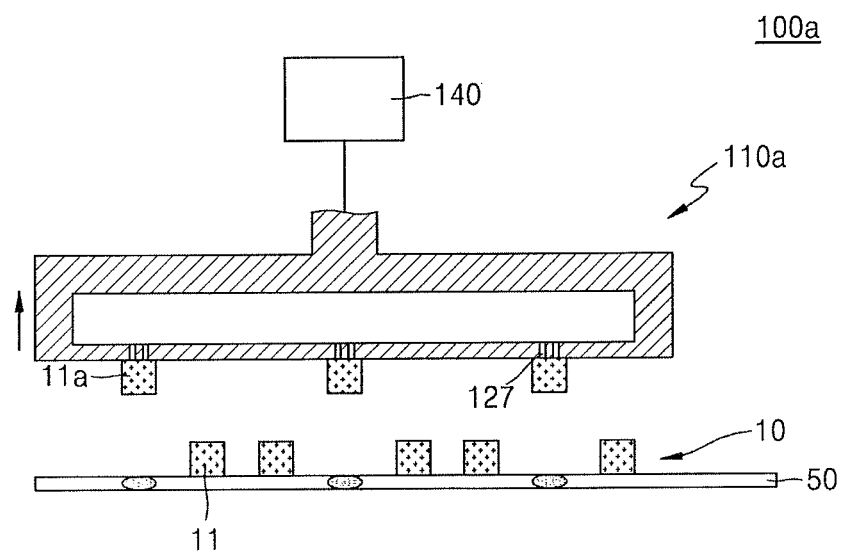

FIGS. 4A and 4B illustrate cross-sectional views of a semiconductor manufacturing apparatus 100a according to some embodiments.

The semiconductor manufacturing apparatus 100a depicted in FIGS. 4A and 4B may have generally the same structure as the semiconductor manufacturing apparatus 100 of FIG. 1 except that the semiconductor manufacturing apparatus 100a may further include an adhesion force controller 150 and the configuration of a transport head 110a, and thus, repeated descriptions of elements provided with reference to FIG. 1 will be omitted or briefly provided.

Referring to FIGS. 4A and 4B, the semiconductor manufacturing apparatus 100a may include the transport head 110a for transporting the light-emitting element chips 11 and the adhesion force controller 150 for partly reducing an adhesion force of the first substrate 50.

The transport head 110a may simultaneously hold a plurality of the light-emitting element chips 11 and simultaneously transport the light-emitting element chips 11. For example, the transport head 110a may selectively hold some of the light-emitting element chips 11 of the chip array 10 (arranged with the first pitch P1 on the first substrate 50), and may arrange the light-emitting element chips 11 held by the transport head 110a on the second substrate that is different from the first substrate 50 with the second pitch P2 greater than the first pitch P1.

In an implementation, the transport head 110a may fix the light-emitting element chips 11 by using a vacuum-holding method, and may have a space therein for forming a vacuum pressure.

In an implementation, the transport head 110a may be the same as the transport head 110 of FIG. 1.

The adhesion force controller 150 may include a first laser irradiator 151 for partly reducing or removing the adhesion force of the first substrate 50 by irradiating a laser, such as a UV laser. The first laser irradiator 151 may partly reduce the adhesion force of a portion of the first substrate 50 by irradiating a laser so that the portion of the first substrate 50 is physically and/or chemically changed.

For example, before the first group of the light-emitting element chips 11a is held by the transport head 110a, the first laser irradiator 151 may partly reduce the adhesion force of the portion of the first substrate 50 by irradiating a laser to the portion of the first substrate 50 which is a region vertically overlapping the first group of the light-emitting element chips 11a. When the adhesion force of the portion of the first substrate 50 is reduced, the transport head 110a may vacuum-hold the first group of the light-emitting element chips 11a. Afterwards, the transport head 110a may be raised, and thus, the first group of the light-emitting element chips 11a is lifted. The adhesion force with respect to the portion of the first substrate 50 may be reduced by the first laser irradiator 151, and the first group of the light-emitting element chips 11a may be readily separated from the first substrate 50. Accordingly, the transport head 110a may readily hold the first group of the light-emitting element chips 11a.

Figure 5A:
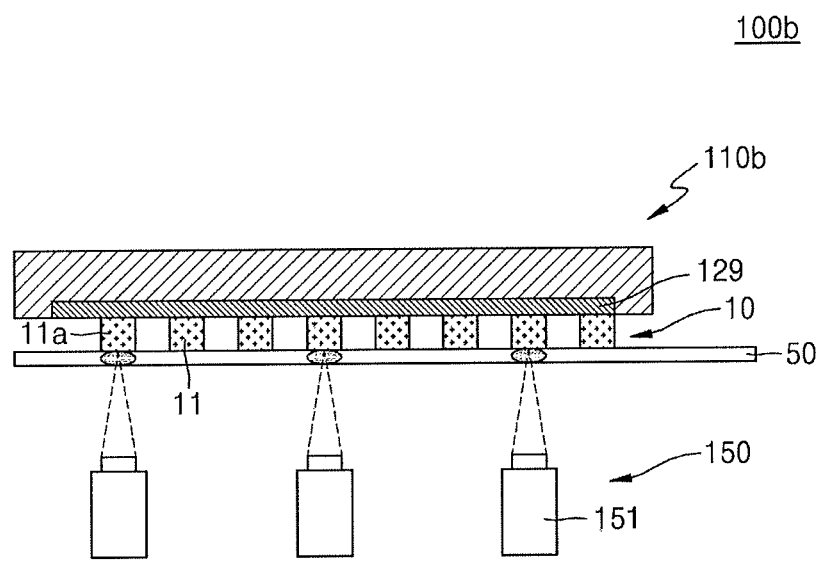
FIGS. 5A and 5B illustrate cross-sectional views of a semiconductor manufacturing apparatus according to some embodiments.
Figure 5B:
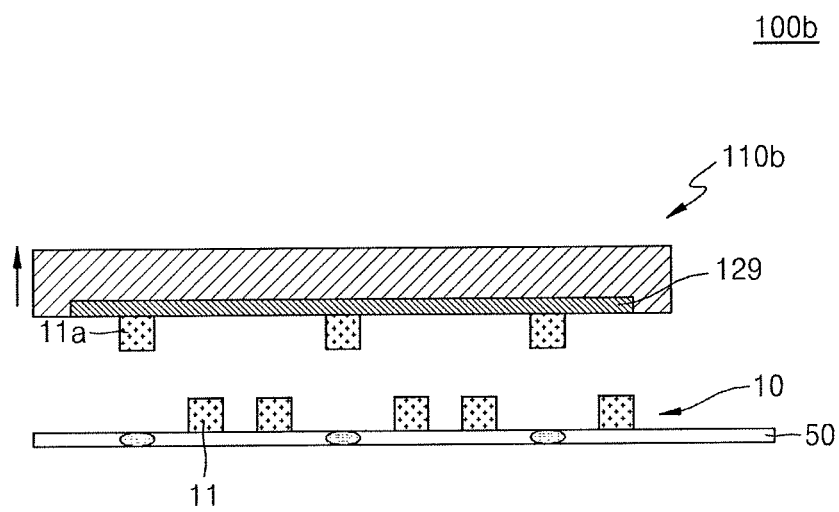

FIGS. 5A and 5B illustrate cross-sectional views of a semiconductor manufacturing apparatus 100b according to some embodiments.

The semiconductor manufacturing apparatus 100b depicted in FIGS. 5A and 5B may have generally the same structure as the semiconductor manufacturing apparatus 100a of FIGS. 4A and 4B except for the configuration of a transport head 110b, and thus, repeated descriptions of elements provided with reference to FIGS. 4A and 4B will be omitted or briefly provided.

Referring to FIGS. 5A and 5B, the semiconductor manufacturing apparatus 100b may include a transport head 110b for transporting light-emitting element chips 11 and an adhesion force controller 150 for partly reducing adhesion force of the first substrate 50. The transport head 110b may be configured to apply a force for generally uniformly fixing the light-emitting element chips 11 on an entire lower surface thereof.

The transport head 110b may include a supporting layer 129 having a predetermined adhesion force, and the supporting layer 129 may hold the light-emitting element chips 11 by being arranged below the transport head 110b. In an implementation, the supporting layer 129 may include polydimethylsiloxane (PDMS).

The selective transport of the light-emitting element chips 11 by the transport head 110b may be implemented by a difference between an adhesion force of the supporting layer 129 and an adhesion formed of the first substrate 50. For example, when the supporting layer 129 of the transport head 110b has a first adhesion force for holding the light-emitting element chips 11, the adhesion force controller 150 controls the adhesion force of a portion of the first substrate 50 which is a region vertically overlapping with the first group of the light-emitting element chips 11a to be less than the first adhesion force, and thus, the first group of the light-emitting element chips 11a may be attached to the transport head 110b. In this case, the first adhesion force of the transport head 110b is less than an adhesion force by which the light-emitting element chips 11 are attached to the first substrate 50 other than the first group of the light-emitting element chips 11a. Accordingly, other light-emitting element chips 11 are fixed (e.g., may remain) on the first substrate 50 without being held or lifted off by the transport head 110b.

Figure 6A:
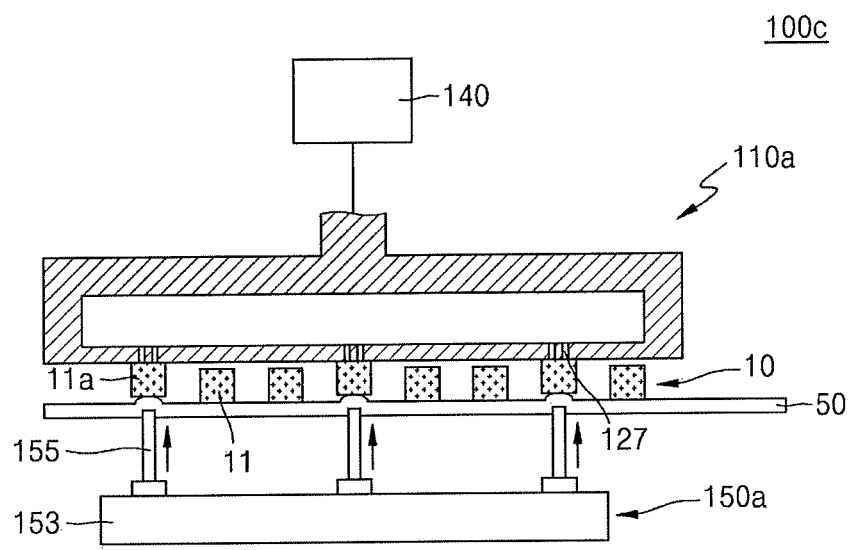
FIGS. 6A and 6B illustrate cross-sectional views of a semiconductor manufacturing apparatus according to some embodiments.
Figure 6B:
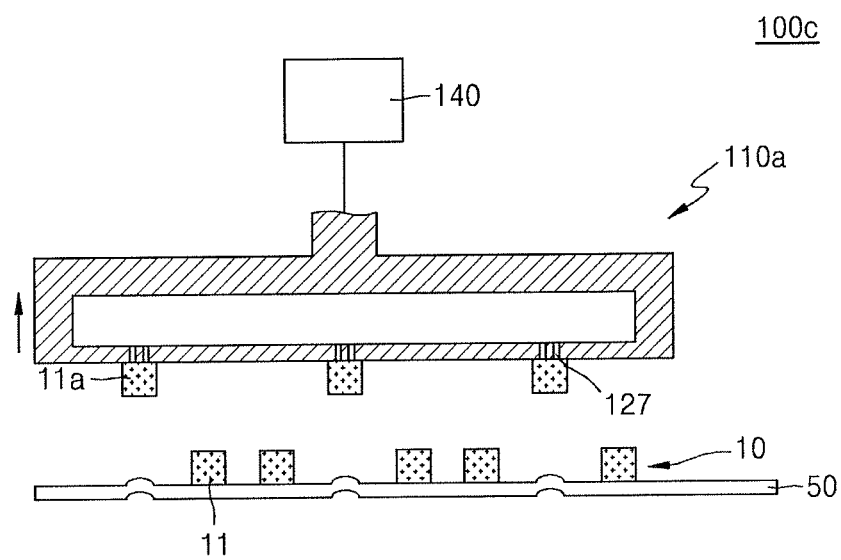

FIGS. 6A and 6B illustrate cross-sectional views of a semiconductor manufacturing apparatus 100c according to some embodiments.

The semiconductor manufacturing apparatus 100c depicted in FIGS. 6A and 6B may have generally the same structure as the semiconductor manufacturing apparatus 100a of FIGS. 4A and 4B except for the configuration of a adhesion force controller 150a, and thus, repeated descriptions of elements provided with reference to FIGS. 4A and 4B will be omitted or briefly provided.

Referring to FIGS. 6A and 6B, the semiconductor manufacturing apparatus 100c may include a transport head 110a for transporting light-emitting element chips 11 and an adhesion force controller 150a for partly reducing adhesion force of the first substrate 50. The adhesion force controller 150a may include an ejector 153 to transform a portion of the first substrate 50 by applying a pressure thereto, wherein the portion of the first substrate 50 is a region of the first substrate 50 vertically overlapping the first group of the light-emitting element chips 11a transported by the transport head 110a.

The ejector 153 may be arranged below the first substrate 50, and may include ejector pins 155 configured to vertically move. The ejector pins 155 may physically transform a predetermined region of the first substrate 50 and may reduce the adhesion force of the predetermined region by contacting and applying a pressure to the predetermined region of the first substrate 50.

Before the light-emitting element chips 11 are held by the transport head 110a, the ejector 153 may be configured to partly reduce an adhesion force of a portion of the first substrate 50 by applying a pressure to the portion of the first substrate 50 by using the ejector pins 155, wherein the portion of the first substrate 50 is a region of the first substrate 50 vertically overlapping the first group of the light-emitting element chips 11a to be transported by the transport head 110a. For example, when the ejector pins 155 apply a pressure to a lower side of the portions of the first substrate 50, edge portions of lower surfaces of the first group of the light-emitting element chips 11a may be separated from the first substrate 50, and accordingly, an adhesion force of the first substrate 50 to hold the first group of the light-emitting element chips 11a may be reduced. When the adhesion force of the portion of the first substrate 50 is reduced by the ejector 153, the transport head 110a may readily hold the first group of the light-emitting element chips 11a.

Figure 7:
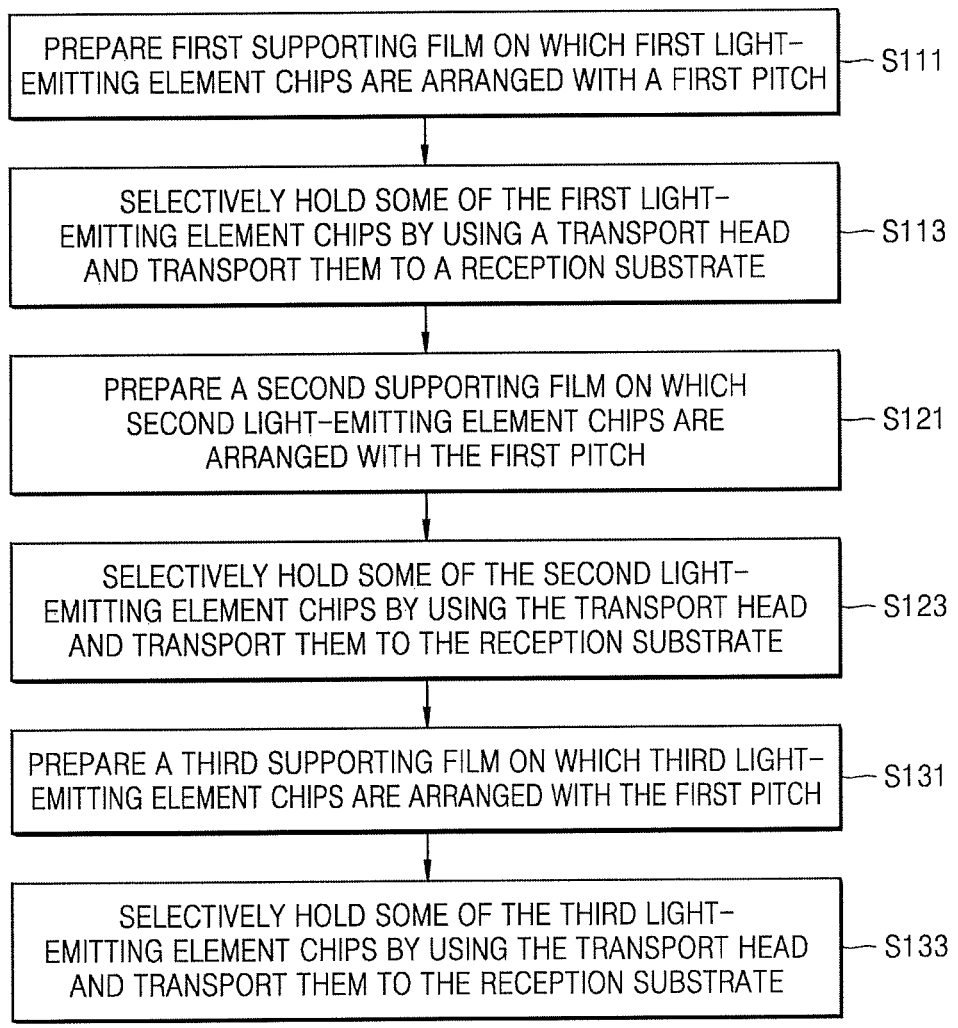
FIG. 7 illustrates a sequential flowchart of a method of re-arranging light-emitting element chips according to some embodiments.
Figure 8A:
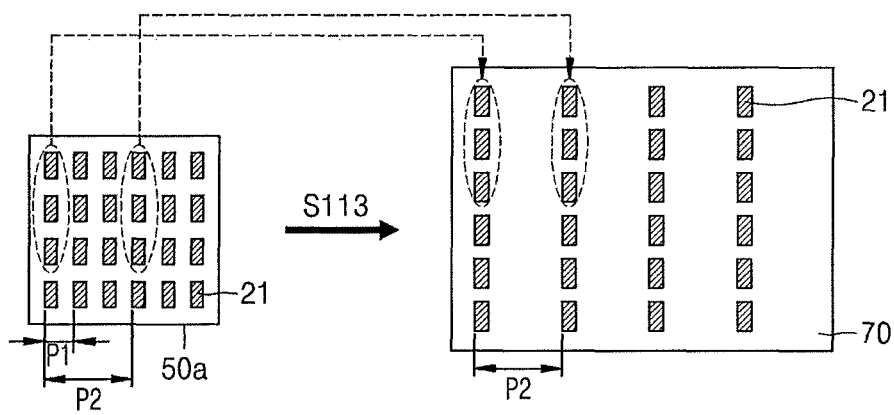
FIGS. 8A through 8C illustrate block diagrams corresponding to the method of re-arranging the light-emitting element chips of FIG. 7.
Figure 8B:
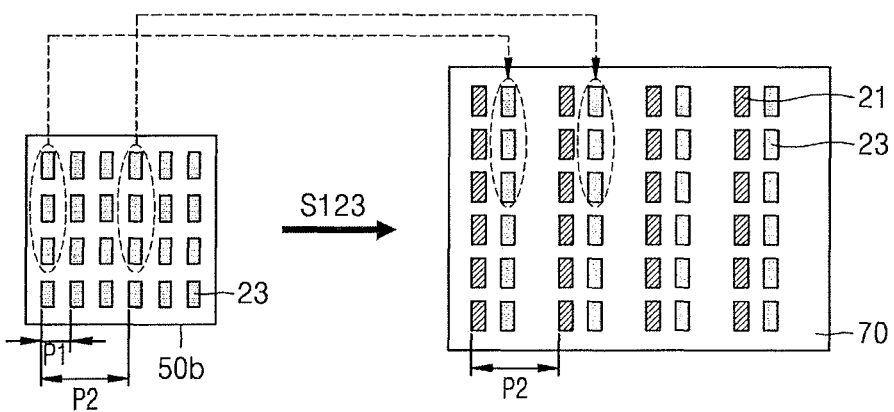
Figure 8C:
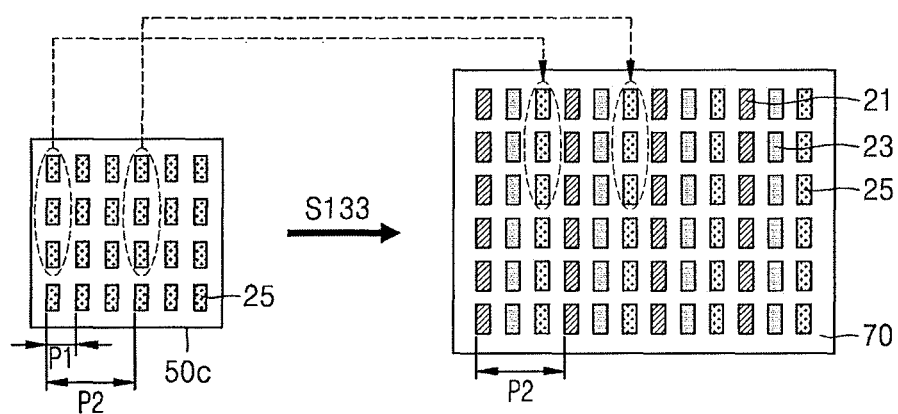

FIG. 7 illustrates a sequential flowchart of a method of re-arranging light-emitting element chips according to some embodiments. FIGS. 8A through 8C illustrate block diagrams corresponding to the method of re-arranging the light-emitting element chips of FIG. 7.

Referring to FIGS. 7 and 8A, a first supporting film 50a, in which first light-emitting element chips 21 are arranged with a first pitch P1, may be prepared (S111). The first light-emitting element chips 21 may be arranged in a two dimensional (2D) array on the first supporting film 50a with the first pitch P1 in a first direction. In an implementation, the first supporting film 50a may have a predetermined adhesion force for holding the first light-emitting element chips 21.

Some of the first light-emitting element chips 21 may be selectively held or lifted by a transport head (for example, the transport head 110 of FIG. 1), and the first light-emitting element chips 21 that are held by the transport head are transported to a reception substrate 70 (S113). Of the first light-emitting element chips 21 on the first supporting film 50a, the transport head may hold some of the first light-emitting element chips 21 arranged with a second pitch P2 (which is greater than the first pitch P1). The selected ones of the first light-emitting element chips 21 held by the transport head may be arranged in a 2D array on a surface of the transport head. The selected ones of the first light-emitting element chips 21 transported to the reception substrate 70 may be arranged in a 2D array with the second pitch P2 in the first direction.

In an implementation, as depicted in FIG. 8A, the transport head may hold the first light-emitting element chips 21 adjacent in a second direction (which is perpendicular to the first direction) and may transport them to the reception substrate 70. In this case, as compared to the arrangement of the first light-emitting element chips 21 on the first supporting film 50a, in the arrangement of the first light-emitting element chips 21 on the reception substrate 70, increased gaps between the first light-emitting element chips 21 in the second direction may be equal.

In an implementation, unlike the arrangement depicted in FIG. 8A, the transport head may selectively hold the first light-emitting element chips 21 separated by gaps larger than the gaps between the first light-emitting element chips 21 adjacent in the second direction and may transport them to the reception substrate 70. In this case, as compared to the arrangement of the first light-emitting element chips 21 on the first supporting film 50a, the arrangement of the first light-emitting element chips 21 on the reception substrate 70 may have gaps increased in the second direction.

Referring to FIGS. 7 and 8B, after arranging the first light-emitting element chips 21 on the reception substrate 70, a second supporting film 50b, on which second light-emitting element chips 23 are arranged with a first pitch P1, may be prepared (S121). Next, the transport head selectively holds or lifts some of (e.g., selected ones of) the second light-emitting element chips 23, and transports the selected ones of the second light-emitting element chips 23 to the reception substrate 70 on which the first light-emitting element chips 21 are already arranged (S123). On the reception substrate 70, the second light-emitting element chips 23 may be arranged in a 2D array in the first direction with the second pitch P2. Also, on the reception substrate 70, each of the second light-emitting element chips 23 may be separated by a predetermined distance from the first light-emitting element chips 21 in the first direction.

Referring to FIGS. 7 and 8C, after arranging the second light-emitting element chips 23 on the reception substrate 70, a third supporting film 50c, on which third light-emitting element chips 25 are arranged, may be prepared (S131). Next, the transport head selectively holds or lifts some of (e.g., selected ones of) the third light-emitting element chips 25, and transports the selected ones of the third light-emitting element chips 25 to the reception substrate 70 on which the first light-emitting element chips 21 and the second light-emitting element chips 23 are arranged (S133). On the reception substrate 70, the third light-emitting element chips 25 may be arranged in a 2D array in the first direction with the second pitch P2. Also, on the reception substrate 70, each of the third light-emitting element chips 25 may be separated by a predetermined distance from the second light-emitting element chips 23 in the first direction.

The first light-emitting element chips 21, the second light-emitting element chips 23, and the third light-emitting element chips 25 may be arranged on the reception substrate 70, and one first light-emitting element chip 21, one second light-emitting element chip 23, and one third light-emitting element chips 25 that are adjacent in the first direction may constitute a package in a subsequent process, and may constitute a pixel. In an implementation, the first light-emitting element chip 21, the second light-emitting element chip 23, and the third light-emitting element chip 25 respectively may be light-emitting element chips for emitting red light, green light, and blue light. In an implementation, the type and number of light-emitting element chips that constitute a single package may be selected as desired.

Each of operations S113, S123, and S133 may be performed by using the semiconductor manufacturing apparatuses 100, 100a, 100b, and 100c depicted in FIG. 1, and FIGS. 4A through 6B described above, and also, may be performed substantially the same way as described with reference to FIGS. 2A through 2E.

Figure 9:
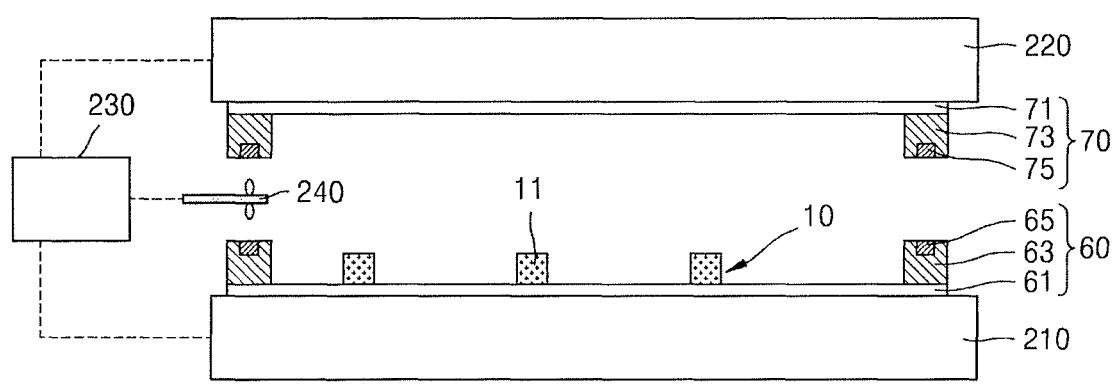
FIG. 9 illustrates a cross-sectional view of a semiconductor manufacturing apparatus according to some embodiments.

FIG. 9 illustrates a cross-sectional view of a semiconductor manufacturing apparatus 200 according to some embodiments.

Referring to FIG. 9, the semiconductor manufacturing apparatus 200 may include a first supporting chuck 210, a second supporting chuck 220, a chuck driver 230, and a vision unit or vision sensor 240. The semiconductor manufacturing apparatus 200 may be a transfer apparatus for transferring a plurality of light-emitting element chips 11 on or from a first substrate 60 to a second substrate 70. In an implementation, the semiconductor manufacturing apparatus 200 may transfer a chip array 10 including the light-emitting element chips 11 arranged with a predetermined pitch on the first substrate to the second substrate 70. The light-emitting element chips 11 transferred by the semiconductor manufacturing apparatus 200 may be arranged with the predetermined pitch on the second substrate 70.

The first supporting chuck 210 may support the first substrate 60. The first supporting chuck 210 may include at least one of a vacuum chuck for supporting the first substrate 60 by using a vacuum pressure, an electrostatic chuck for supporting the first substrate 60 by using an electrostatic force, and a mechanical chuck for supporting the first substrate 60 by using a mechanical clamping method.

The first substrate 60 may fix the chip array 10 to be transferred by the transfer apparatus, and may be arranged on a surface of the first supporting chuck 210. The first substrate 60 may include a first film 61 having a predetermined adhesion force for holding the light-emitting element chips 11 and first film frame 63 arranged on edges of the first film 61 to support the first film 61. The first film frame 63 may have, e.g., a rectangular frame shape.

The first substrate 60 may include first align marks 65 for aligning the first supporting chuck 210 and the second supporting chuck 220. The first align marks 65 may be formed by using, e.g., a printing method or a laser marking method. In an implementation, the first align marks 65 may be arranged on the first film frame 63. In an implementation, unlike the first align marks 65 depicted in FIG. 9, the first align marks 65 may be arranged on the first film 61.

The second supporting chuck 220 may support the second substrate 70, and may be arranged above the first supporting chuck 210 so that the first substrate 60 faces the second substrate 70. The second supporting chuck 220 may include one of the vacuum chuck, the electrostatic chuck, and the mechanical chuck.

The second substrate 70 may fix the chip array 10 transferred from the first substrate 60, and may be arranged on a surface of the second supporting chuck 220. The second substrate 70 may include a second film 71 having a predetermined adhesion force for holding the light-emitting element chips 11 and second film frame 73 arranged on edges of the second film 71 to support the second film 71. The second film frame 73 may have a shape corresponding to that of the first film frame 63, e.g., a rectangular frame shape.

The second substrate 70 may include second align marks 75 for aligning the first supporting chuck 210 and the second supporting chuck 220. In an implementation, the second align marks 75 may be arranged on the second film frame 73. In an implementation, unlike the second align marks 75 depicted in FIG. 9, the second align marks 75 may be arranged on the second film 71.

The chuck driver 230 may drive the first supporting chuck 210 and the second supporting chuck 220. The chuck driver 230 may include a driving mechanism for driving the first supporting chuck 210 and the second supporting chuck 220. For example, the driving mechanism may include an actuator.

In an implementation, the chuck driver 230 may vertically arrange the first supporting chuck 210 and the second supporting chuck 220. For example, the vision sensor 240 may recognize the first align marks 65 and the second align marks 75, and the chuck driver 230 may align the first supporting chuck 210 and the second supporting chuck 220 based on the information recognized by the vision sensor 240.

Also, the chuck driver 230 may move at least one of the first supporting chuck 210 and the second supporting chuck 220 so that the chip array 10 on the first film 61 is attached to the second film 71. For example, the chuck driver 230 may lift the first supporting chuck 210 so that the chip array 10 of the first film 61 is attached to the second film 71. In an implementation, the second film 71 may have an adhesion force greater than that of the first film 61, and accordingly, the light-emitting element chips 11 may be transferred to the second film 71 having a relatively large adhesion force from the first film 61 having a relatively small adhesion force.

FIGS. 10A through 10H illustrate cross-sectional views of stages in a transfer process of the light-emitting element chips 11 by using the semiconductor manufacturing apparatus 200 of FIG. 9.

Figure 10A:
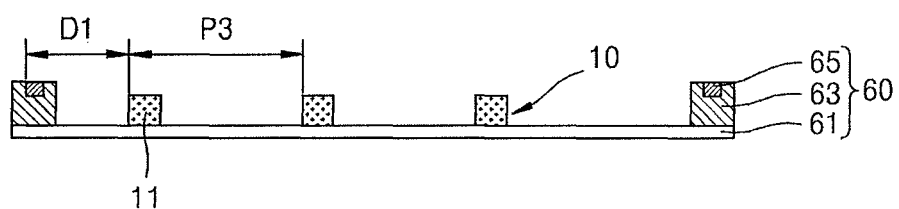
FIGS. 10A through 10H illustrate cross-sectional views of stages in a transfer process of light-emitting element chips by using the semiconductor manufacturing apparatus of FIG. 9.

Referring to FIG. 10A, the chip array 10 may be arranged on the first film 61 of the first substrate 60. The light-emitting element chips 11 of the chip array 10 may be arranged on the first film 61 with a third pitch P3. Also, the light-emitting element chip 11 that is most adjacent to, e.g., closest to, an edge of the first film 61 may be separately arranged by a first distance D1 from the first align mark 65.

Figure 10B:
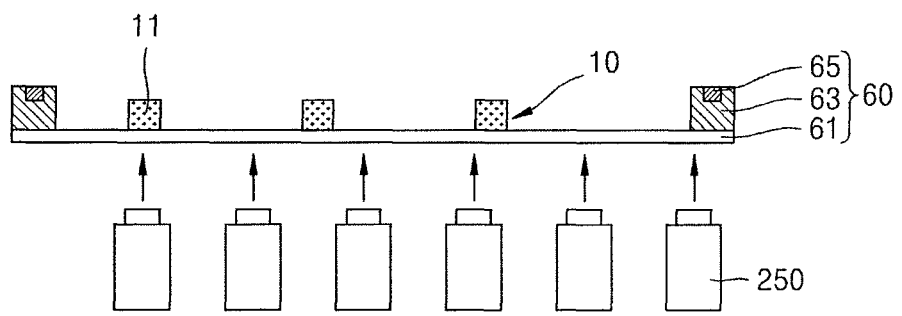

Referring to FIG. 10B, a laser may be irradiated to the first film 61 from second laser irradiators 250 so that the adhesion force of the first film 61 is reduced. The second laser irradiators 250 may reduce adhesion force between the first film 61 and the light-emitting element chips 11 so that the adhesion force between the first film 61 and the light-emitting element chips 11 is lower than that between the second film (referred to 71 of FIG. 10D) and the light-emitting element chips 11. In an implementation, in the case when the adhesion force between the first film 61 and the light-emitting element chips 11 is sufficiently lower than that between the second film 71 and the light-emitting element chips 11, the operation of reducing the adhesion force between the first film 61 and the light-emitting element chips 11 by using the second laser irradiators 250 may be omitted. In FIG. 10B, a plurality of the second laser irradiators 250 are depicted. In an implementation, the adhesion force between the first film 61 and the light-emitting element chips 11 may be reduced by moving one of the second laser irradiators 250. In an implementation, the second laser irradiators 250 may irradiate a laser from below the first film 61, and also, may be irradiated from above the first film 61.

Figure 10C:
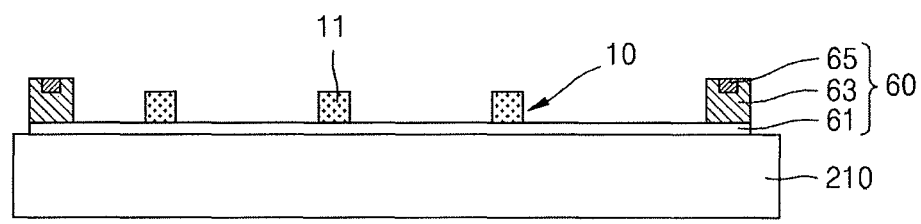

Referring to FIG. 10C, the first substrate 60 may be arranged on the first supporting chuck 210. The first supporting chuck 210 may support the first substrate 60 placed on a surface thereof. For example, the first substrate 60 may support the first substrate 60 by vacuum-holding the first film 61.

Figure 10D:
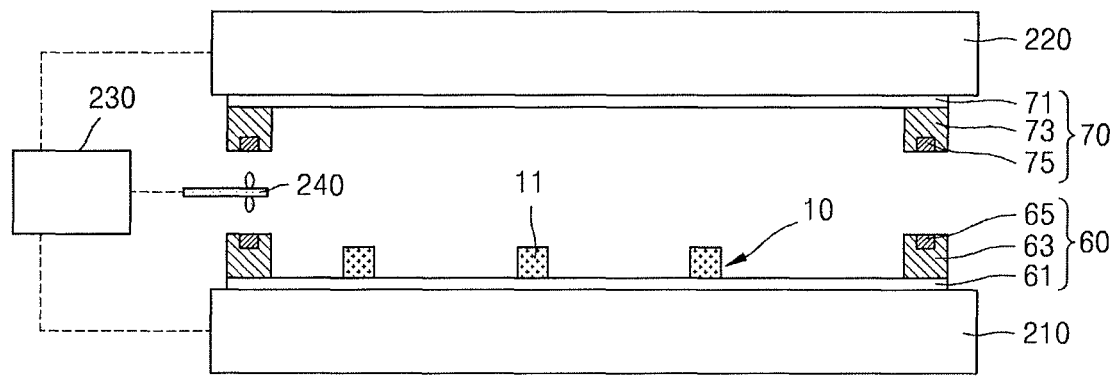

Referring to FIG. 10D, the second supporting chuck 220 that supports the second substrate 70 may be prepared, and the second supporting chuck 220 may be arranged above the first supporting chuck 210 so that the second film 71 of the second substrate 70 faces the first film 61.

Next, the first supporting chuck 210 and the second supporting chuck 220 may be aligned. For example, the first film frame 63 of the first substrate 60 may be vertically aligned with the second film frame 73 of the second substrate 70. In an implementation, in order to align the first supporting chuck 210 with the second supporting chuck 220, the vision sensor 240 may respectively recognize the first align marks 65 of the first substrate 60 and the second align marks 75 of the second substrate 70. Based on the recognized information by the vision sensor 240, the chuck driver 230 may move at least one of the first supporting chuck 210 and the second supporting chuck 220 so that the first supporting chuck 210 and the second supporting chuck 220 are vertically aligned.

Figure 10E:
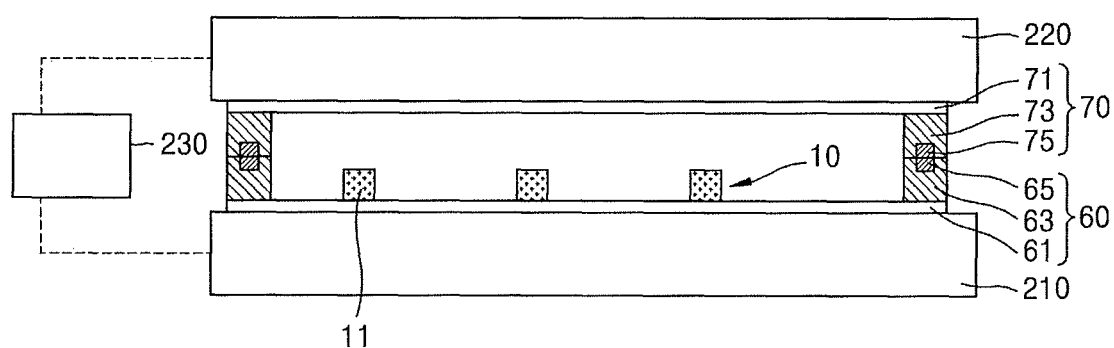

Referring to FIG. 10E, the chuck driver 230 may vertically move at least one of the first supporting chuck 210 and the second supporting chuck 220 so that the first film frame 63 of the first substrate 60 and the second film frame 73 of the second substrate 70 contact each other.

Figure 10F:
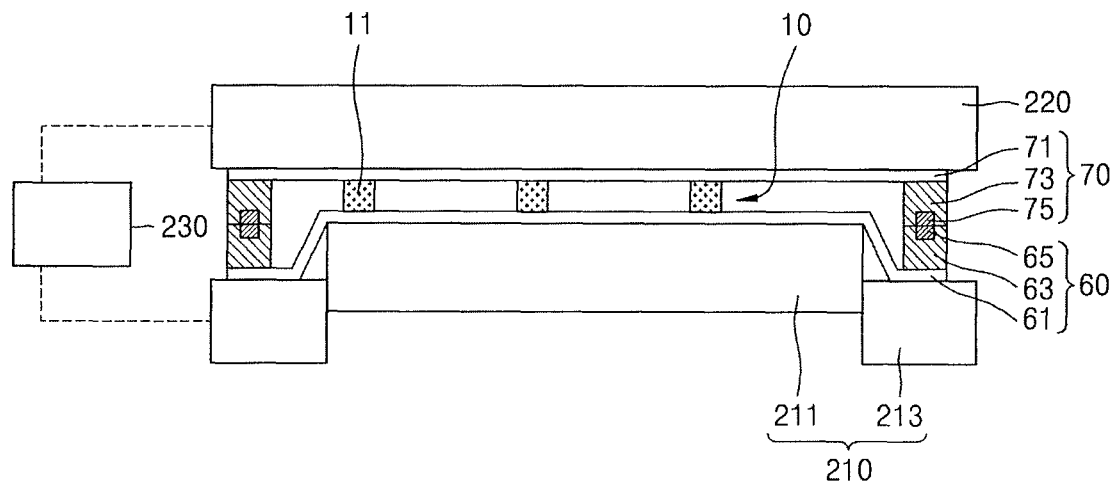

Referring to FIG. 10F, the chuck driver 230 may drive the first supporting chuck 210 and the second supporting chuck 220 so that the chip array 10 on the first film contacts the second film 71. For example, the first supporting chuck 210 may include a central portion 211 where the light-emitting element chips 11 are located and peripheral portions 213 where the first film frame 63 are located. The central portion 211 may be configured to be moved by the chuck driver 230. In this case, in a state in which the peripheral portions 213 are fixed on a predetermined position, the chuck driver 230 may attach the light-emitting element chips 11 to the second film 71 by lifting the central portion 211 of the first supporting chuck 210.

Figure 10G:
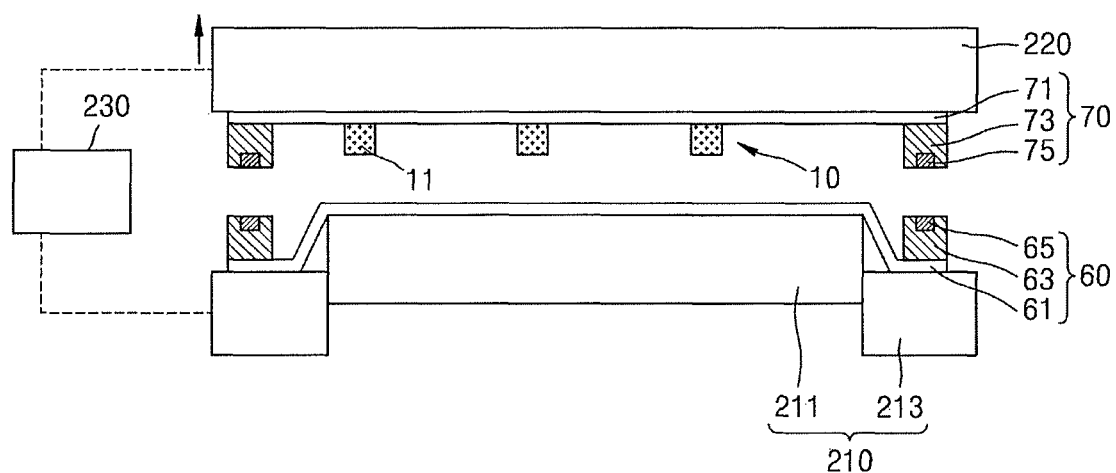

Referring to FIG. 10G, the chuck driver 230 may separate the light-emitting element chips 11 from the first substrate 60 by lifting the second supporting chuck 220. The light-emitting element chips 11 may be attached to the second film 71 having an adhesion force greater than that of the first film 61, and the light-emitting element chips 11 may be separated from the first substrate 60 and may be lifted together with the second substrate 70.

Figure 10H:
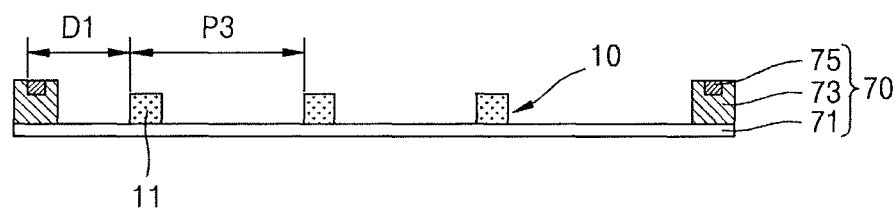

Referring to FIG. 10H, the second substrate 70 may be separated from the second supporting chuck 220. The light-emitting element chips 11 transferred to the second substrate 70 may be arranged with a third pitch P3. Also, similar to the light-emitting element chip 11 on the first substrate 60 depicted in FIG. 10A, the light-emitting element chip 11 that is most adjacent to an edge of the second film 71 may be separately arranged by the first distance D1 from the second align mark 75.

In the semiconductor manufacturing apparatus 200 according to the present embodiment, a multiple number of light-emitting element chips 11 may be simultaneously transferred, and thus, the light-emitting element chips 11 may be rapidly arranged on a target substrate. Also, when the second supporting chuck 220 according to the present embodiment is used, the light-emitting element chips 11 may be transferred through an alignment and contact of a substrate to be transferred and a transferring substrate without performing a pick-and-place process, thus, reproducibility with respect to minute sized light-emitting element chips 11 may be increased.

Figure 11:
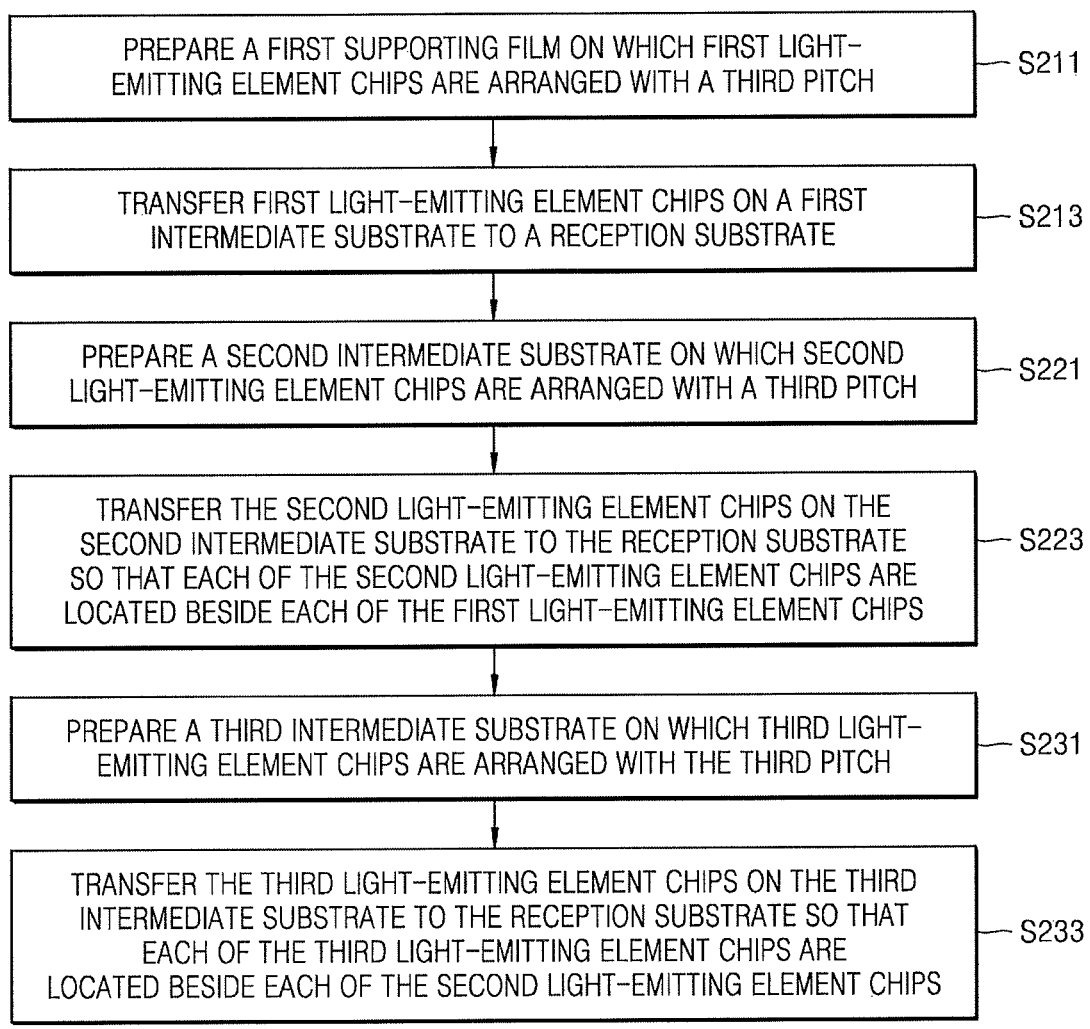
FIG. 11 illustrates a sequential flowchart of a method of re-arranging light-emitting element chips according to some embodiments.
Figure 12A:
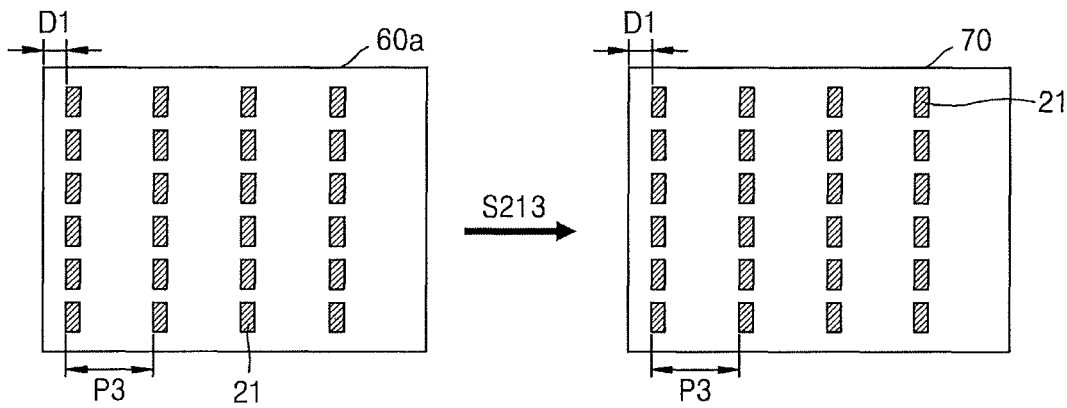
FIGS. 12A through 12C illustrate block diagrams corresponding to the method of re-arranging the light-emitting element chips of FIG. 11.
Figure 12B:
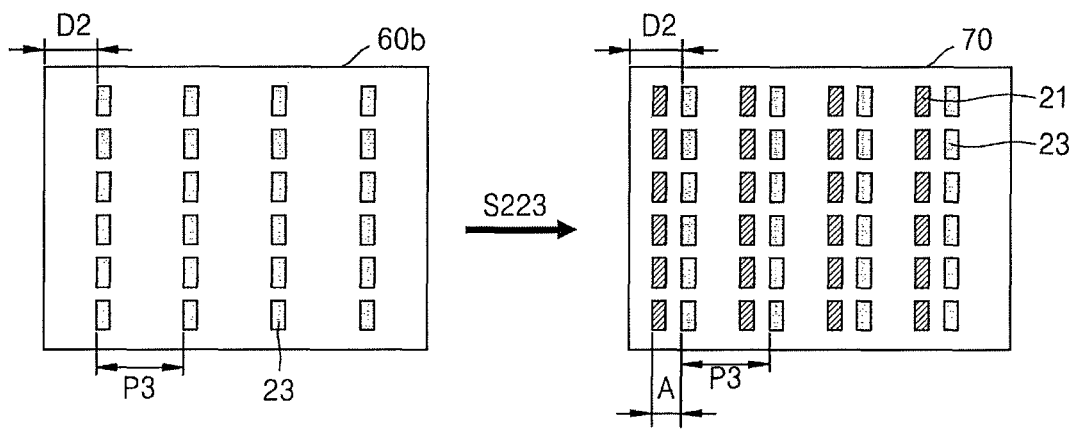
Figure 12C:
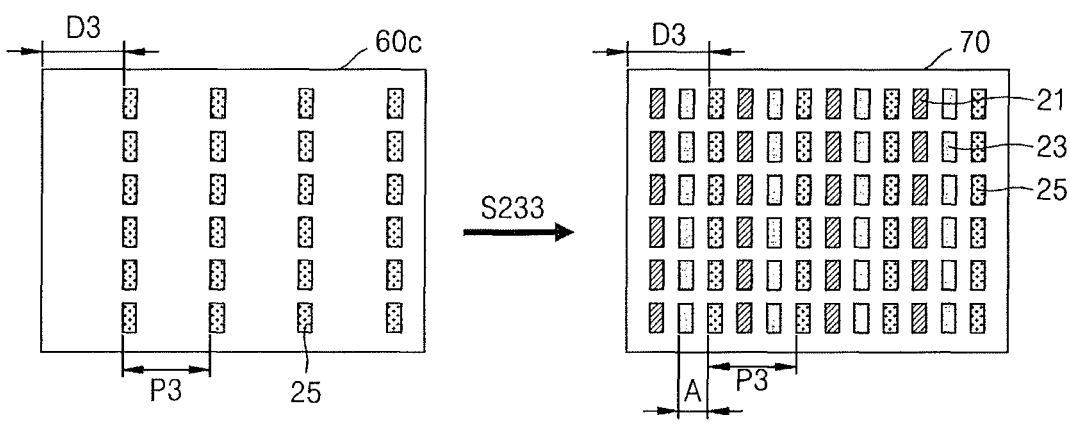

FIG. 11 illustrates a sequential flowchart of a method of re-arranging light-emitting element chips according to some embodiments. FIGS. 12A through 12C illustrate block diagrams corresponding to the method of re-arranging the light-emitting element chips of FIG. 11.

Referring to FIGS. 11 and 12A, a first intermediate substrate 60a, on which a plurality of first light-emitting element chips 21 are arranged with a third pitch P3, is prepared (S211). The first light-emitting element chips 21 may be arranged in a 2D array on the first intermediate substrate 60a, and may be arranged with the third pitch P3 in a first direction. Also, the first light-emitting element chip 21 that is closest to an edge of the first intermediate substrate 60a may be separately arranged by a first distance D1 from the edge of the first intermediate substrate 60a.

Next, the first light-emitting element chips 21 on the first intermediate substrate 60a may be transferred to the reception substrate 70 (S213). The arrangement of the first light-emitting element chips 21 transferred to the reception substrate 70 may be equal to that arrangement of the first light-emitting element chips 21 on the first intermediate substrate 60a. For example, the first light-emitting element chips 21 may be arranged in a 2D array, and may be arranged with the third pitch P3 in the first direction. Also, the first light-emitting element chip 21 that is closest to an edge of the reception substrate 70 may be separately arranged by the first distance D1 from the edge of the reception substrate 70.

Referring to FIGS. 11 and 12B, after arranging the first light-emitting element chips 21 on the reception substrate 70, a second intermediate substrate 60b, on which second light-emitting element chips 23 are arranged with the third pitch P3, may be prepared (S221). On the second intermediate substrate 60b, the second light-emitting element chip 23 that is closest to an edge of the second intermediate substrate 60b may be separately arranged by a second distance D2 from the edge of the second intermediate substrate 60b. In an implementation, the second distance D2 may be greater than the first distance D1, and may be equal to the sum of the first distance D1 and a chip-between-pitch A.

Next, the second light-emitting element chips 23 on the second intermediate substrate 60b are transferred to the reception substrate 70 on which the first light-emitting element chips 21 are arranged so that each of the second light-emitting element chips 23 are located beside each of the first light-emitting element chips 21 (S223). On the reception substrate 70, the second light-emitting element chips 23 may be arranged in a 2D array, and may be arranged with the third pitch P3 with respect to the first direction. Also, on the reception substrate 70, each of the second light-emitting element chips 23 may be respectively spaced apart from each of the first light-emitting element chips 21 by the chip-between-pitch A in the first direction.

Referring to FIGS. 11 and 12C, after arranging the second light-emitting element chips 23 on the reception substrate 70, a third intermediate substrate 60c, on which third light-emitting element chips 25 are arranged with the third pitch P3, may be prepared (S231). On the third intermediate substrate 60c, the third light-emitting element chip 25 that is closest to an edge of the third intermediate substrate 60c may be spaced apart from the edge of the third intermediate substrate 60c by a third distance D3. In an implementation, the third distance D3 may be greater than the second distance D2, and may be equal to the sum of the second distance D2 and the chip-between-pitch A.

Next, the third light-emitting element chips 25 on the third intermediate substrate 60c may be transferred to the reception substrate 70, on which the first light-emitting element chips 21 and the second light-emitting element chips 23 are arranged, so that each of the third light-emitting element chips 25 are located beside each of the second light-emitting element chips 23 (S233). On the reception substrate 70, the third light-emitting element chips 25 may be arranged in a 2D array, and may be arranged with the third pitch P3 with respect to the first direction. Also, on the reception substrate 70, each of the third light-emitting element chips 25 may be spaced apart from the second light-emitting element chips 23 in the first direction by as much as the chip-between-pitch A. The one first light-emitting element chip 21, the one second light-emitting element chip 23, and the third light-emitting element chip 25 that are adjacent in the first direction may constitute a single package in a subsequent process, and may configure a single pixel.

Each of operations S213, S223, and S233 may be performed by using the semiconductor manufacturing apparatus 200 depicted in FIG. 9, and may be performed substantially similar to the transfer method described with reference to FIGS. 10A through 10H.

Figure 13:
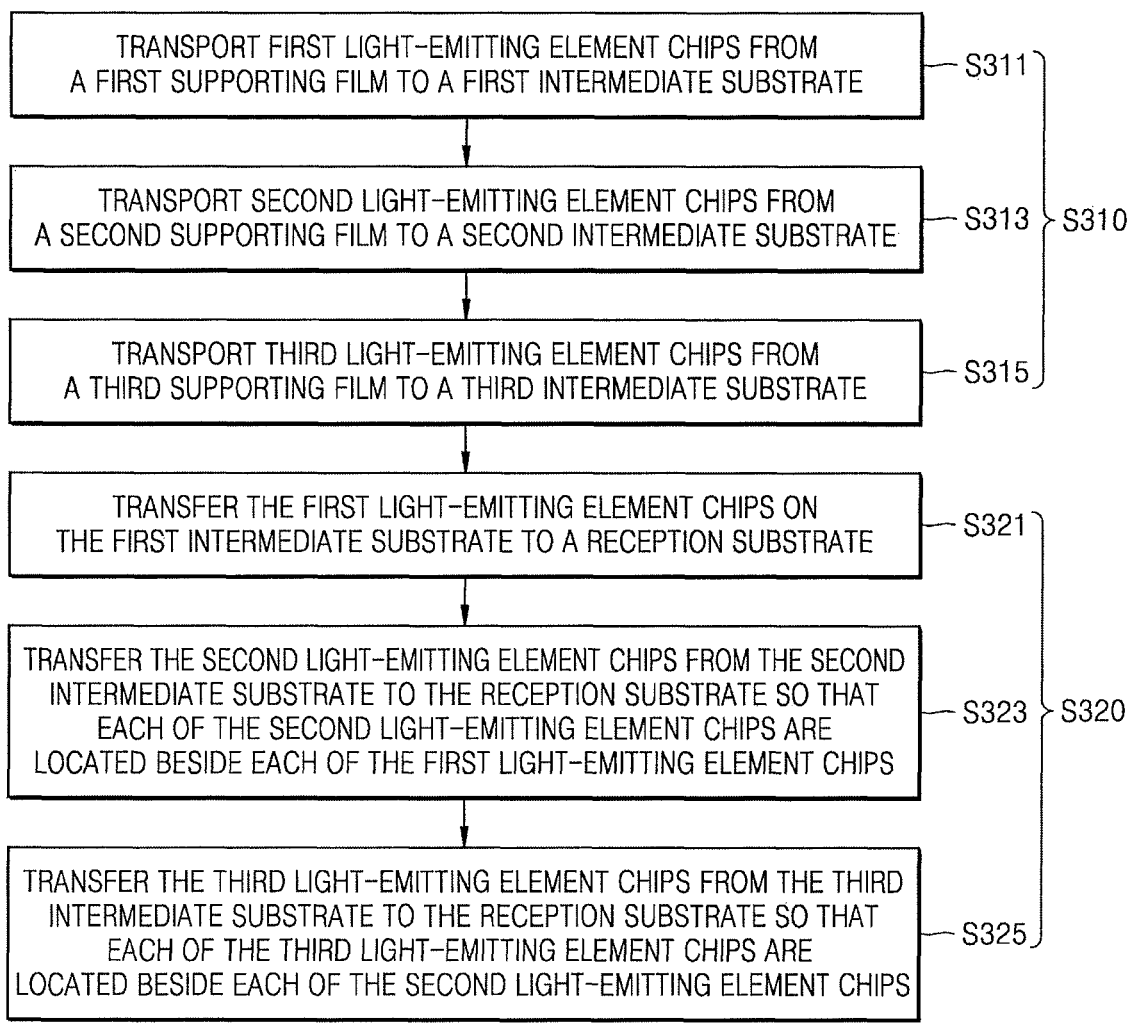
FIG. 13 illustrates a sequential flowchart of a method of re-arranging light-emitting element chips according to some embodiments of the inventive concept.
Figure 14:
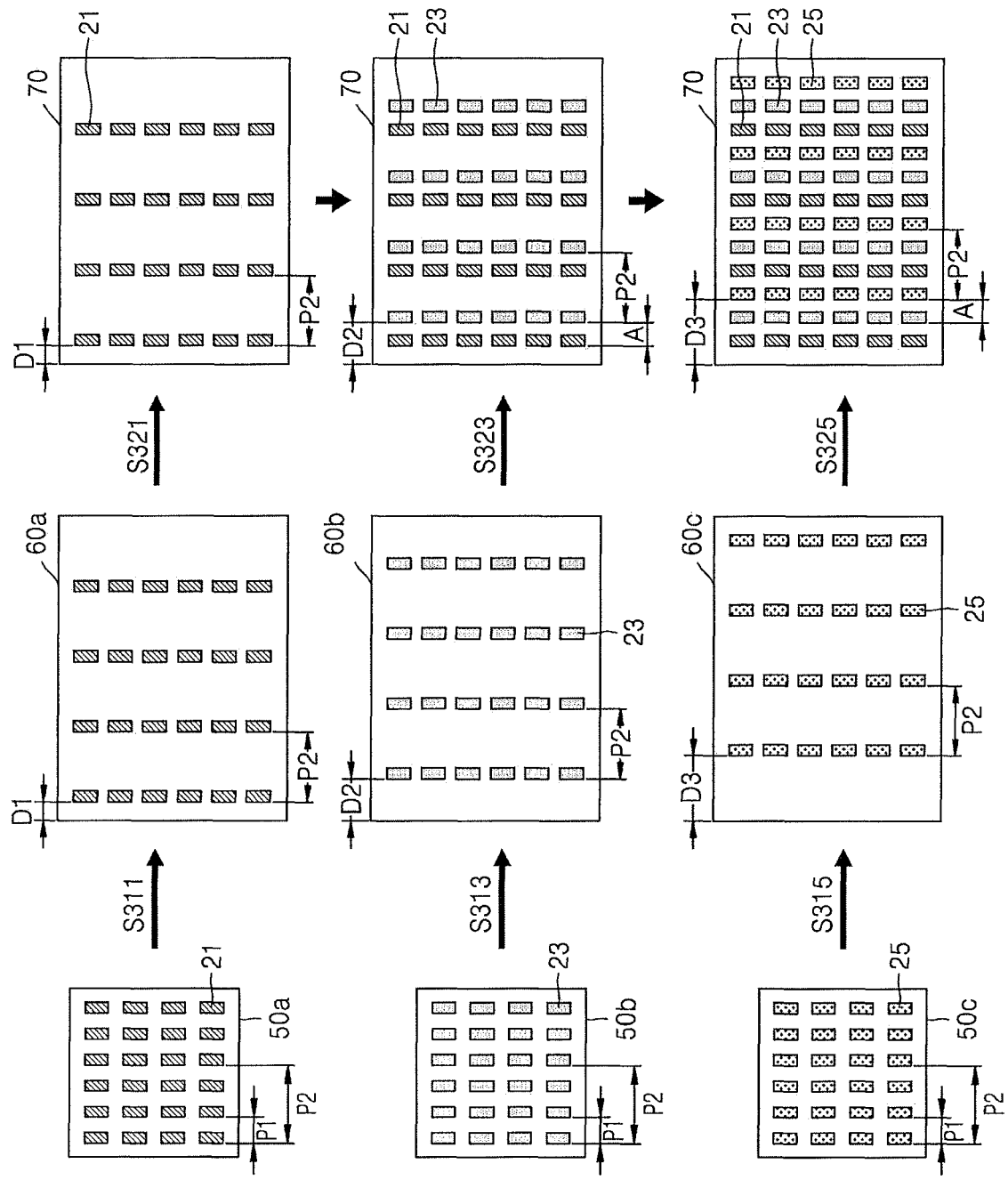
FIG. 14 illustrates a block diagram corresponding to the method of re-arranging the light-emitting element chips of FIG. 13.

FIG. 13 illustrates a sequential flowchart of a method of re-arranging light-emitting element chips according to some embodiments. FIG. 14 illustrates a block diagram corresponding to the method of re-arranging the light-emitting element chips of FIG. 13.

Referring to FIGS. 13 and 14, transferring processes with respect to the first light-emitting element chips 21, the second light-emitting element chips 23, and the third light-emitting element chips 25 may be performed (S310).

For example, the first supporting film 50a, on which the first light-emitting element chips 21 are arranged with the first pitch P1, may be prepared, and afterwards, the first light-emitting element chips 21 may be transferred to the first intermediate substrate 60a from the first supporting film 50a (S311). The first light-emitting element chips 21 may be transferred to the first intermediate substrate 60a from the first supporting film 50a so that a distance between chips is increased. For example, the first light-emitting element chips 21 may be arranged on the first intermediate substrate 60a with the second pitch P2 greater than the first pitch P1. Afterwards, similar to the method of transferring the first light-emitting element chips 21, the second light-emitting element chips 23 may be transferred to the second intermediate substrate 60b from the second supporting film 50b (S313), and third light-emitting element chips 25 may be transferred to the third intermediate substrate 60c from the third supporting film 50c (S315). The transfer of the first light-emitting element chips 21, the second light-emitting element chips 23, and the third light-emitting element chips 25 may be performed by using the semiconductor manufacturing apparatuses 100, 100a, 100b, and 100c, and may be performed substantially similar to the transfer method described with reference to FIGS. 2A through 2E.

Next, transfer processes with respect to the first light-emitting element chips 21, the second light-emitting element chips 23, and the third light-emitting element chips 25 may be performed (S320). The transfer process with respect to the first light-emitting element chips 21 (S321), the transfer process with respect to the second light-emitting element chips 23 (S323), and the transfer process with respect to the third light-emitting element chips 25 (S325) may be sequentially performed. The transfer process with respect to the first light-emitting element chips 21 (S321), the transfer process with respect to the second light-emitting element chips 23 (S323), and the transfer process with respect to the third light-emitting element chips 25 (S325) may be performed substantially the same way as described with reference to FIG. 11 and FIGS. 12A through 12C.

FIGS. 15A through 15F illustrate cross-sectional views of stages in a method of manufacturing a display device 300 according to some embodiments.

Figure 15A:
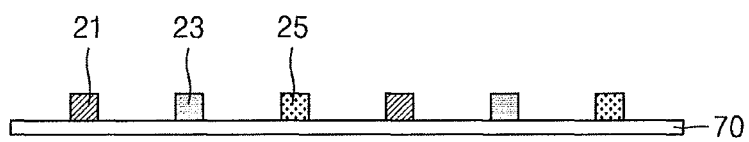
FIGS. 15A through 15F illustrate sequential flowcharts of a method of manufacturing a display device according to some embodiments.

Referring to FIG. 15A, a reception substrate 70, on which first light-emitting element chips 21, second light-emitting element chips 23, and third light-emitting element chips 25 are arranged, may be prepared. The first light-emitting element chips 21, the second light-emitting element chips 23, and the third light-emitting element chips 25 respectively may be light-emitting element chips for emitting red light, light-emitting element chips for emitting green light, and light-emitting element chips for emitting blue light. One first light-emitting element chip, one second light-emitting element chip, and one third light-emitting element chip, which are adjacent to each other, may constitute a single pixel.

Figure 15B:
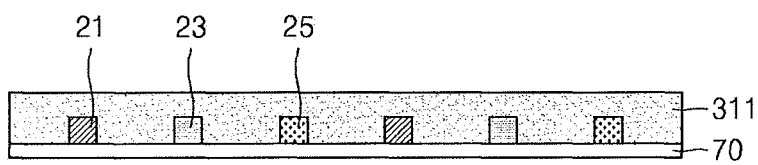

Referring to FIG. 15B, a molding layer 311 covering the first light-emitting element chips 21, the second light-emitting element chips 23, and the third light-emitting element chips 25 may be formed on a surface of the reception substrate 70.

Figure 15C:
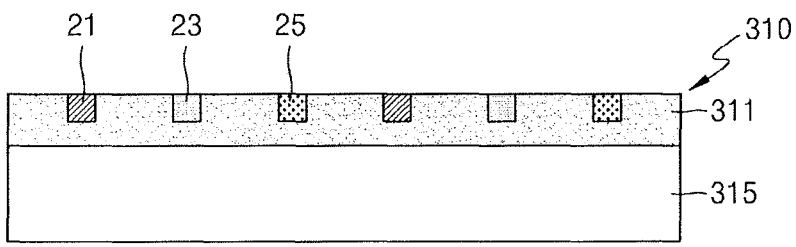

Referring to FIG. 15C, after the molding process, a structure 310 including the first through third light-emitting element chips 21, 23, and 25 and the molding layer 311 may be separated from the reception substrate 70. After the separation process, the structure 310 may be placed on a carrier substrate 315, and lower surfaces of the first through third light-emitting element chips 21, 23, and 25 may be exposed to the outside.

Figure 15D:
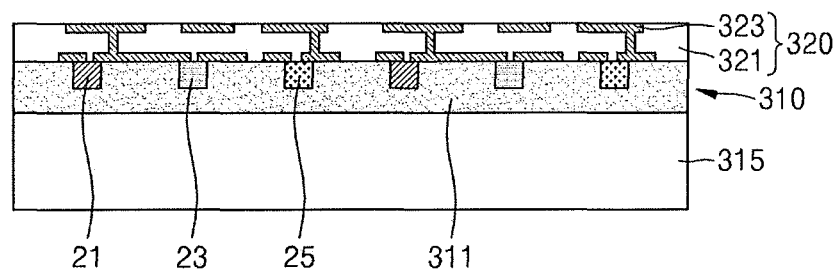

Referring to FIG. 15D, a wiring structure 320 may be formed on a surface of the structure 310 where the lower surfaces of the first through third light-emitting element chips 21, 23, and 25 are located. The wiring structure 320 may include an insulating layer 321 and a conductive pattern 323 in the insulating layer 321. The conductive pattern 323 may be electrically connected to the first through third light-emitting element chips 21, 23, and 25.

Figure 15E:
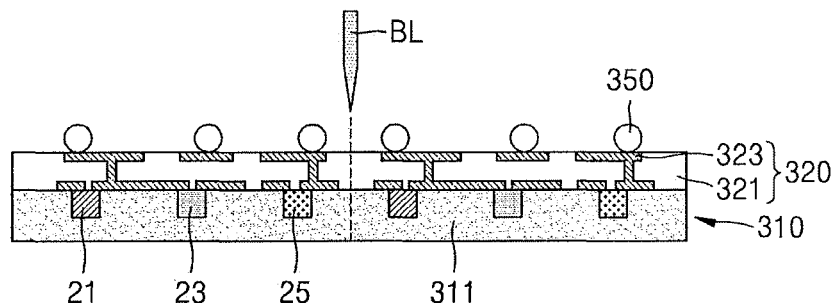

Referring to FIG. 15E, connection terminals 350 that are connected to the conductive pattern 323 may be formed on a surface of the wiring structure 320. The connection terminals 350 may be, e.g., bumps or solder balls. After forming the connection terminals 350, the wiring structure 320 and the structure 310 may be singulated or cut into individual light-emitting packages by using a blade BL. The light-emitting packages 340 may include the first through third light-emitting element chips 21, 23, and 25.

Figure 15F:
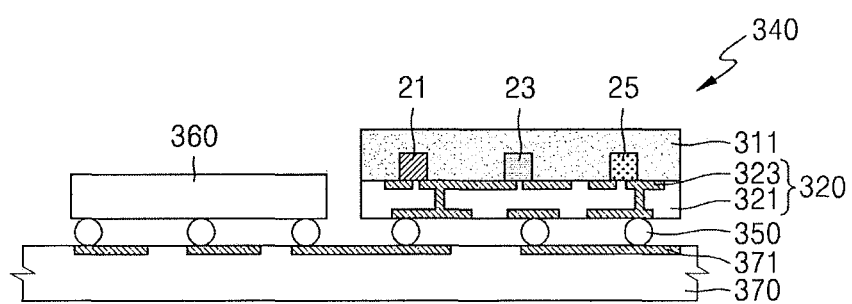

Referring to FIG. 15F, after the light-emitting packages 340 are manufactured, the display device 300 may be manufactured by mounting the light-emitting packages 340 on a module substrate 370. The display device 300 may include a driving part 360 mounted on the module substrate 370 to apply power and signals to the light-emitting package 340. The light-emitting package 340 and the driving parts 360 respectively may be electrically connected to wiring layers 371 through the connection terminals 350.

The embodiments may provide a method of arranging a plurality of light-emitting element chips more correctly and rapidly on a module substrate.

The embodiments may provide a semiconductor manufacturing apparatus configured to arrange light-emitting element chips on a target substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor manufacturing apparatus, comprising:
a transport head that includes a vacuum chuck, the vacuum chuck being configured to vacuum-hold light emitting element chips;
a vacuum pump that is configured to provide a vacuum pressure to the transport head; and
a first laser irradiator,
wherein:
the vacuum chuck includes a porous material layer and a buffer layer on the porous material layer,
the buffer layer includes a plurality of protrusions and vacuum holes, the vacuum holes extending from a surface of the buffer layer that contacts the porous material layer to lower surfaces of the protrusions,
the transport head:
 is configured to transport a plurality of light-emitting element chips arranged with a first pitch on a supporting film to an intermediate substrate by vacuum-holding the light-emitting element chips, and
 is configured to arrange the vacuum-held light-emitting element chips on the intermediate substrate with a second pitch which is greater than the first pitch, and
the first laser irradiator:
 is configured to partly reduce an adhesion force of the supporting film by irradiating a laser, and
 is configured to irradiate a laser to a portion of the supporting film which is a region vertically overlapping a first group of light-emitting element chips arranged with the second pitch among the light-emitting element chips.
2. The semiconductor manufacturing apparatus as claimed in claim 1, wherein the porous material layer includes pores having a pore size in a range from about 0.1 μm to about 20 μm.
3. The semiconductor manufacturing apparatus as claimed in claim 1, wherein the transport head further includes a chuck frame covering side surfaces of the porous material layer and a surface of the porous material layer that is opposite to a surface of the porous material layer that contacts the buffer layer.
4. The semiconductor manufacturing apparatus as claimed in claim 1, further comprising a transfer apparatus configured to transfer the light-emitting element chips on the intermediate substrate to a reception substrate,
wherein the transfer apparatus includes:
a first supporting chuck configured to support the intermediate substrate;
a second supporting chuck configured to support the reception substrate and is arranged above the first supporting chuck so that the reception substrate faces the intermediate substrate; and a chuck driver configured to move at least one of the first supporting chuck and the second supporting chuck so that the light-emitting element chips on the intermediate substrate are attached to the reception substrate.

5. The semiconductor manufacturing apparatus as claimed in claim 4, wherein:
the intermediate substrate includes a first film, and
the reception substrate includes a second film having an adhesion force greater than that of the first film.

6. The semiconductor manufacturing apparatus as claimed in claim 4, wherein the transfer apparatus, further includes a second laser irradiator configured to irradiate a laser to the intermediate substrate so that an adhesion force of the intermediate substrate is reduced.

7. The semiconductor manufacturing apparatus as claimed in claim 4, wherein:
the intermediate substrate includes a first aligning mark,
the reception substrate includes a second aligning mark,
the transfer apparatus further includes a vision sensor configured to recognize the first and second aligning marks, and
the chuck driver aligns the first supporting chuck and the second supporting chuck based on information recognized by the vision sensor.

8. A semiconductor manufacturing apparatus comprising:
a transport head that includes a vacuum chuck, the vacuum chuck being configured to vacuum-hold light-emitting element chips;
a vacuum pump that is configured to provide a vacuum pressure to the transport head; and
an ejector,
wherein:
the vacuum chuck includes a porous material layer and a buffer layer on the porous material layer,
the buffer layer includes a plurality of protrusions and vacuum holes, the vacuum holes extending from a surface of the buffer layer that contacts the porous material layer to lower surfaces of the protrusions,
the transport head:
is configured to transport a plurality of light-emitting element chips arranged with a first pitch on a supporting film to an intermediate substrate by vacuum-holding the light-emitting element chips, and
is configured to arrange the vacuum-held light-emitting element chips on the intermediate substrate with a second pitch which is greater than the first pitch, and
the ejector:
is configured to partly reduce an adhesion force of the supporting film by pressing the supporting film, and
is configured to transform by pressing a portion of the supporting film which is a region vertically overlapping a first group of light-emitting element chips arranged with the second pitch among the light-emitting element chips.

* * * * *